(12) United States Patent
Takagiwa et al.

(10) Patent No.: US 6,759,896 B2
(45) Date of Patent: Jul. 6, 2004

(54) SEMICONDUCTOR INTEGRATED CIRCUIT AND SEMICONDUCTOR MEMORY HAVING A VOLTAGE STEP-DOWN CIRCUIT STEPPING EXTERNAL POWER SUPPLY VOLTAGE DOWN TO INTERNAL POWER SUPPLY VOLTAGE

(75) Inventors: Teruo Takagiwa, Kanagawa-ken (JP); Masami Masuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/246,272

(22) Filed: Sep. 18, 2002

(65) Prior Publication Data

US 2003/0058032 A1 Mar. 27, 2003

(30) Foreign Application Priority Data

Sep. 21, 2001 (JP) .................................... P2001-290131

(51) Int. Cl.[7] ................................................. G05F 1/10
(52) U.S. Cl. ....................................................... 327/540
(58) Field of Search ................................ 327/530, 534, 327/535, 538, 540, 541

(56) References Cited

U.S. PATENT DOCUMENTS

| 5,295,112 A | | 3/1994 | Taniguchi | |
| 5,337,284 A | * | 8/1994 | Cordoba et al. | 365/227 |
| 5,352,935 A | * | 10/1994 | Yamamura et al. | 327/540 |
| 6,172,932 B1 | * | 1/2001 | Kim | 365/227 |
| 6,313,694 B1 | * | 11/2001 | Sohn | 327/541 |
| 6,342,808 B1 | * | 1/2002 | Bae | 327/537 |

FOREIGN PATENT DOCUMENTS

| JP | 07-085678 | 3/1995 |
| JP | 10-208467 | 8/1998 |

* cited by examiner

Primary Examiner—Jeffrey Zweizig
(74) Attorney, Agent, or Firm—Hogan & Hartson, LLP

(57) ABSTRACT

A semiconductor integrated circuit, including an internal circuit, a transition state voltage step-down circuit generating an internal power supply voltage supplied to the internal circuit from an external power supply voltage only for a fixed time period after the internal circuit is changed from a standby state to an active state, and a steady state voltage step-down circuit generating the internal power supply voltage from the external power supply voltage for the duration that the internal circuit is in either the standby state or the active state.

20 Claims, 12 Drawing Sheets

SEMICONDUCTOR INTEGRATED CIRCUIT AND SEMICONDUCTOR MEMORY HAVING A VOLTAGE STEP-DOWN CIRCUIT STEPPING EXTERNAL POWER SUPPLY VOLTAGE DOWN TO INTERNAL POWER SUPPLY VOLTAGE

CROSS REFERENCE TO RELATED APPLICATIONS

This application is based upon and claims the benefit of priority from the prior Japanese Patent Application P2001-290131 filed on Sep. 21, 2001; the entire contents of which are incorporated herein by reference.

BACKGROUND OF THE INVENTION

1. Field of the Invention

The present invention relates to a semiconductor integrated circuit and semiconductor memory. In particular, it relates to a semiconductor integrated circuit and semiconductor memory including a voltage step-down circuit, which steps down an external power supply voltage to an internal power supply voltage, supplying an internal circuit.

2. Description of the Related Art

In response to recent improvements in microfabrication technology, techniques for achieving high integration and speed by setting the internal power supply voltage to be lower than the external power supply voltage, have been actively studied. The voltage step-down circuit is a fundamental technical element stepping down the external power supply voltage to the internal power supply voltage. The internal power supply voltage is to be supplied to the internal circuit. The external power supply voltage is supplied from a power supply terminal on a semiconductor chip.

The voltage step-down circuit includes a comparator circuit and a p-type MOS transistor, which is driven by the external power supply voltage. The comparator circuit controls the gate voltage of the p-type MOS transistor. The internal power supply voltage is supplied from the drain electrode of the p-type MOS transistor under gate control by the comparator circuit. There is an internal capacitance between the internal power supply voltage and ground potential. The internal power supply voltage is supplied to the internal circuit, which consumes electric current.

As illustrated in FIG. 1, when the internal circuit changes from a standby state 10 to an active state 11, current dissipation IDD of the internal circuit changes greatly. The change in current dissipation IDD causes fluctuation in the internal power supply voltage VINT, interfering with the high-speed operation of the internal circuit. Fluctuation in the internal power supply voltage VINT is greatest immediately after changing from the standby state 10 to the active state 11, and then gradually decreases.

In order to reduce fluctuation in the internal power supply voltage VINT, an increase in internal capacitance, or the enlargement of the comparator circuit and p-type MOS transistor is necessary. However, the increasing the internal capacitance is not easy due to limitations in chip area. The enlargement of the comparator circuit and p-type MOS transistor causes an increase in current consumption of the voltage step-down circuit itself, which is undesirable.

Considering a steady supply of internal power supply voltage VINT, a "stop clock" technique is used, whereby a plurality of voltage step-down circuits are uniformly distributed within the semiconductor chip, some step-down circuits are halted in the standby state, reducing the overall current consumption of the step-down circuits. However, while the "stop clock" technique may reduce step-down circuit current consumption in the standby state, the "stop clock" technique does not allow the reduction of step-down circuit current consumption in an active state.

SUMMARY OF THE INVENTION

A first aspect of the present invention provides a semiconductor integrated circuit including an internal circuit, a transition state voltage step-down circuit generating an internal power supply voltage supplied to the internal circuit from an external power supply voltage only for a fixed time period after the internal circuit is changed from a standby state to an active state, and a steady state voltage step-down circuit generating the internal power supply voltage from the external power supply voltage for duration that the internal circuit is in either the standby state or the active state.

A second aspect of the present invention provides a semiconductor memory including a memory circuit, a transition state voltage step-down circuit generating an internal power supply voltage supplied to the memory circuit from an external power supply voltage only for a fixed time period after the memory circuit is changed from a standby state to an active state, and a steady state voltage step-down circuit generating the internal power supply voltage from the external power supply voltage for duration that the memory circuit is in either the standby state or the active state.

DETAILED DESCRIPTION OF THE INVENTION

Figure 1:
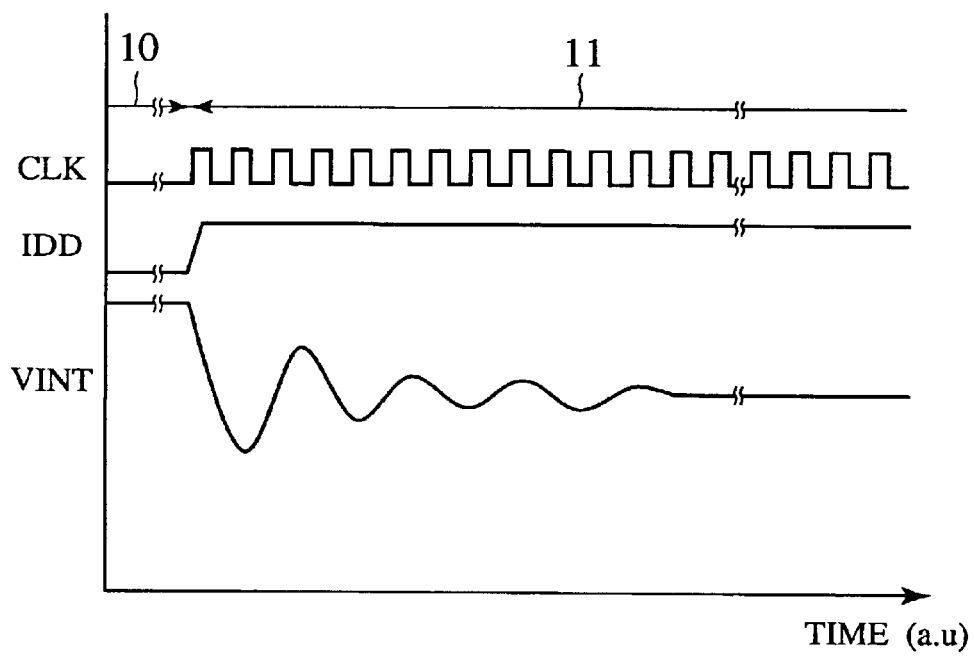
FIG. 1 is a timing chart showing a clock signal, current dissipation of the internal circuit, and change in the internal power supply voltage over time according to the related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
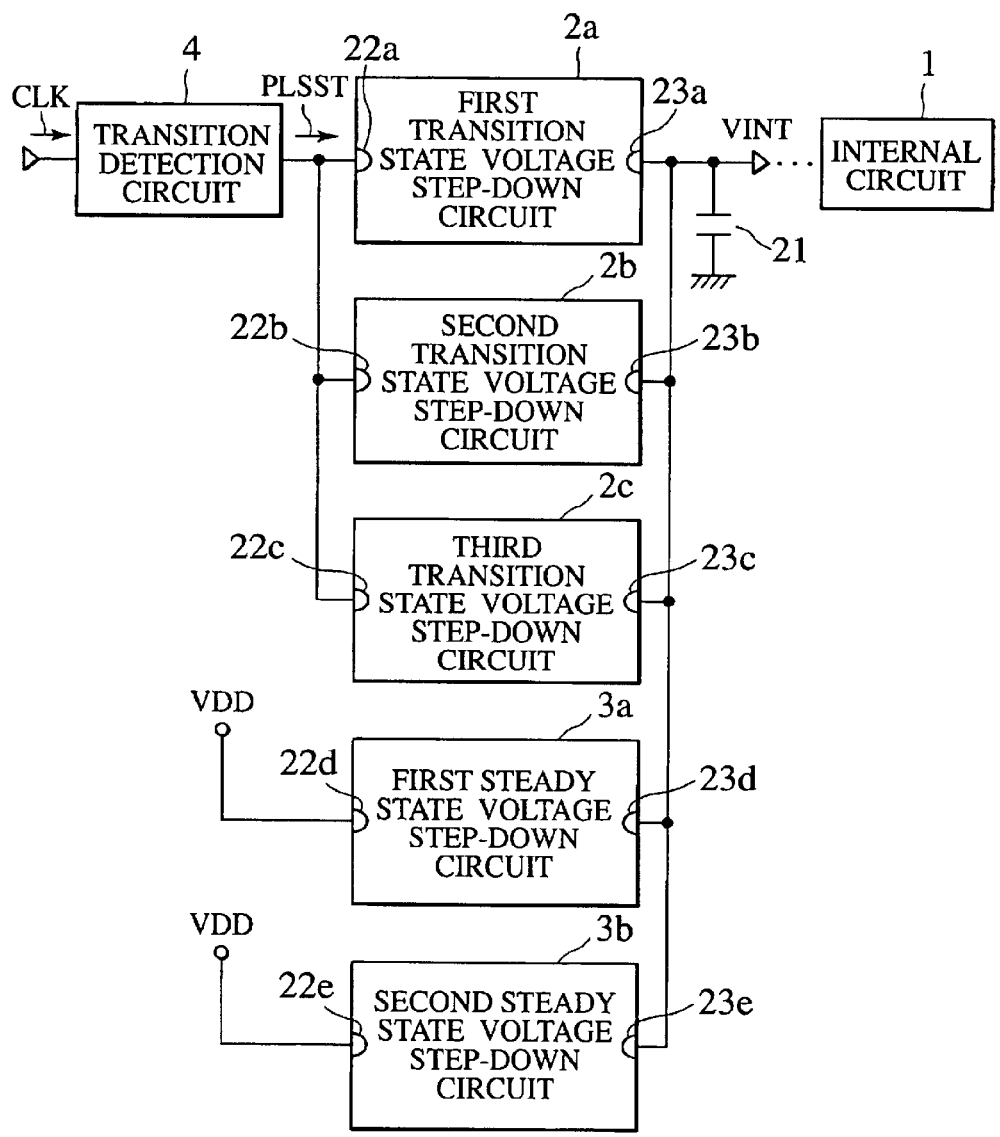
FIG. 2 is a block diagram showing a semiconductor integrated circuit according to a first embodiment of the present invention.

As shown in FIG. 2, a semiconductor integrated circuit according to the first embodiment includes an internal circuit 1, first through third transition state voltage step-down circuits 2a through 2c, and first and second steady state voltage step-down circuits 3a and 3b, which generate an internal power supply voltage VINT to be supplied to the internal circuit 1 from the external power supply voltage VDD, and a capacitor 21. The internal circuit 1 implements the key functions of the semiconductor integrated circuit.

The first through third transition state voltage step-down circuits 2a through 2c operate for a fixed time period only after the internal circuit 1 has changed from standby state to active state. The first and second steady state voltage step-down circuits 3a and 3b operate while the internal circuit 1 is in either standby state or active state. Here, "operate" indicates the generation of internal power supply voltage VINT from the external power supply voltage VDD. The "active state" indicates a state where a clock signal CLK is supplied to the internal circuit 1, and the "standby state" indicates a state where a clock signal CLK is not supplied to the internal circuit 1.

The semiconductor integrated circuit further includes a transition detection circuit 4. The transition detection circuit 4 detects the change from standby state to active state and then transmits a pulse signal PLSST to the first through third transition state voltage step-down circuits 2a through 2c. The pulse signal PLSST has a pulse width corresponding to the above-mentioned "fixed time period".

The first through third transition state voltage step-down circuits 2a through 2c, and the first and second steady state voltage step-down circuits 3a and 3b respectively have output terminals 23a through 23c, 23d and 23e, which provide the internal power supply voltage VINT. The first through third transition state voltage step-down circuits 2a through 2c, and the first and second steady state voltage step-down circuits 3a and 3b are connected in parallel to the output terminals 23a through 23c, 23d and 23e. The first through third transition state voltage step-down circuits 2a through 2c, and the first and second steady state voltage step-down circuits 3a and 3b generate the internal power supply voltages VINTs. Each of the internal power supply voltages VINTs is supplied to the internal circuit 1. The capacitor 21 is connected between the output terminals 23a–23e and the ground, whereby a predetermined internal capacitance is deployed for the internal power supply voltage VINT.

The first through third transition state voltage step-down circuits 2a through 2c, and the first and second steady state voltage step-down circuits 3a and 3b respectively have control terminals 22a through 22c, 22d and 22e. A pulse signal PLSST is transferred to the control terminals 22a through 22c of the first through third transition state voltage step-down circuits 2a through 2c. An external power supply voltage VDD is applied to the control terminals 22d and 22e of the first and second steady state voltage step-down circuits 3a and 3b. A clock signal CLK is supplied to the transition detection circuit 4 as with the internal circuit 1.

Figure 3:
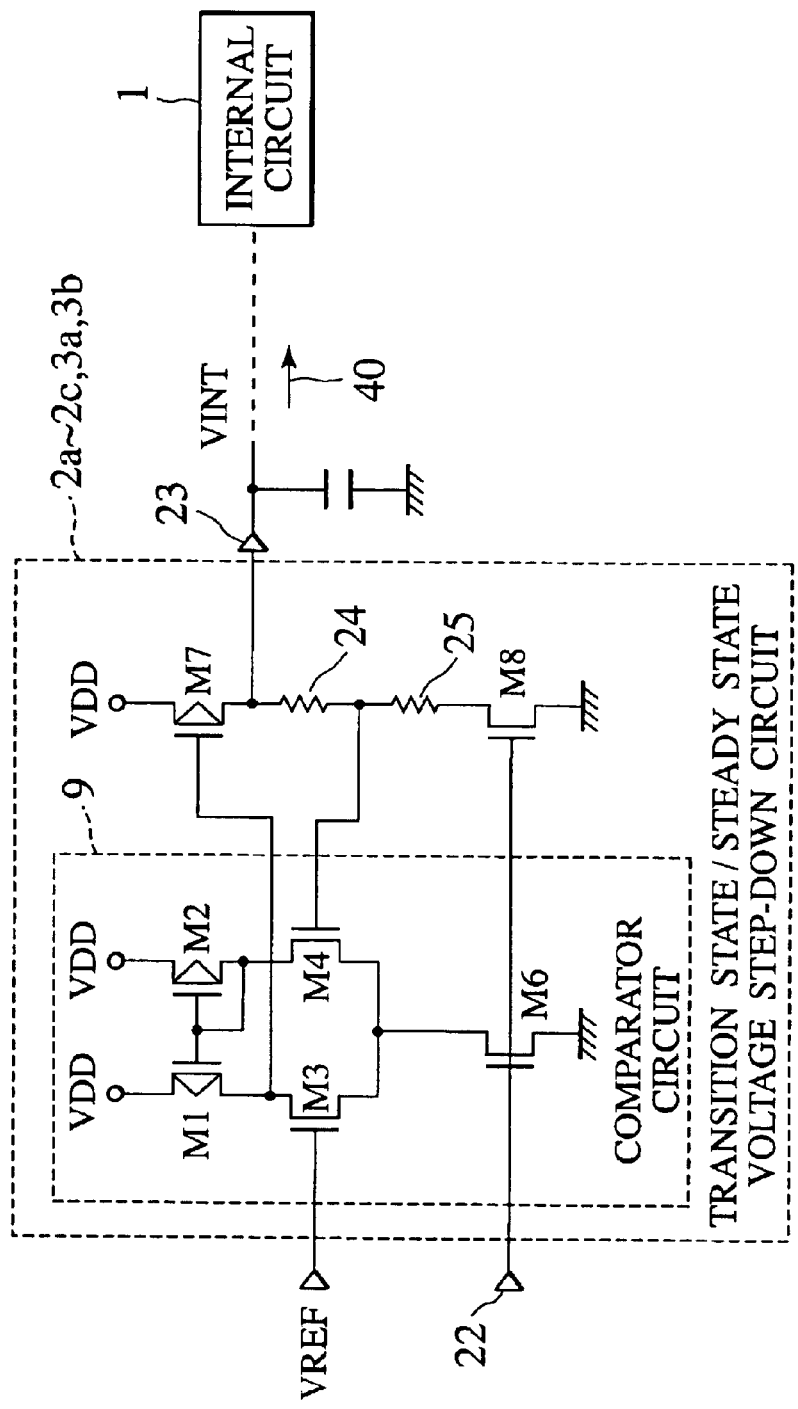
FIG. 3 is a circuit diagram illustrating the first through third transition state voltage step-down circuits, and first and second steady state voltage step-down circuits illustrated in FIG. 2.

The first through third transition state voltage step-down circuits 2a through 2c, and the first and second steady state voltage step-down circuits 3a and 3b respectively have the same circuitry. As illustrated in FIG. 3, the first through third transition state voltage step-down circuits 2a through 2c, and the first and second steady state voltage step-down circuits 3a and 3b have a comparator circuit 9, a p-type MOS transistor M7, an n-type MOS transistor M8, a first resistor 24, and a second resistor 25. The comparator circuit 9 includes first and second p-type MOS transistors M1 and M2, and first and second n-type MOS transistors M3 and M4. The first and second p-type MOS transistors M1 and M2 form a current mirror circuit. A reference voltage VREF, which does not depend on the external power supply voltage VDD, is applied to the gate electrode of the first n-type MOS transistor M3. The drain electrode of the first n-type MOS transistor M3 is connected to the gate electrode of the p-type MOS transistor M7. The p-type MOS transistor M7, first resistor 24, second resistor 25 and n-type MOS transistor M8 are serially connected. An external power supply voltage VDD is applied to the source electrode of the p-type MOS transistor M7. A ground potential is applied to the source electrode of the n-type MOS transistor M8. The gate electrode of the second n-type MOS transistor M4 is connected in between the first resistor 24 and second resistor 25.

The comparator circuit 9 drives the p-type MOS transistor M7 such that the gate voltage of the second n-type MOS transistor M4 matches the reference voltage VREF. The output terminal 23 is connected to the drain electrode of the p-type MOS transistor M7. Accordingly, the internal power supply voltage VINT may be represented by:

$$VINT=(1+R1/R2)VREF. \qquad (1)$$

Here, "R1" and "R2" respectively indicate the resistance values of resistor 24 and resistor 25. An internal power supply voltage VINT is applied to the internal circuit 1, whereby the internal circuit 1 consumes an electric current 40. It should be noted that the control terminal 22 is connected to the gate electrodes of the n-type MOS transistors M6 and M8, respectively. By controlling the turning on and off of the n-type MOS transistors M6 and M8 with the potential of the control terminal 22, the overall operation of the first through third transition state voltage step-down circuits 2a through 2c, and the first and second steady state voltage step-down circuits 3a and 3b including the comparator circuit 9 is controlled.

Figure 4:
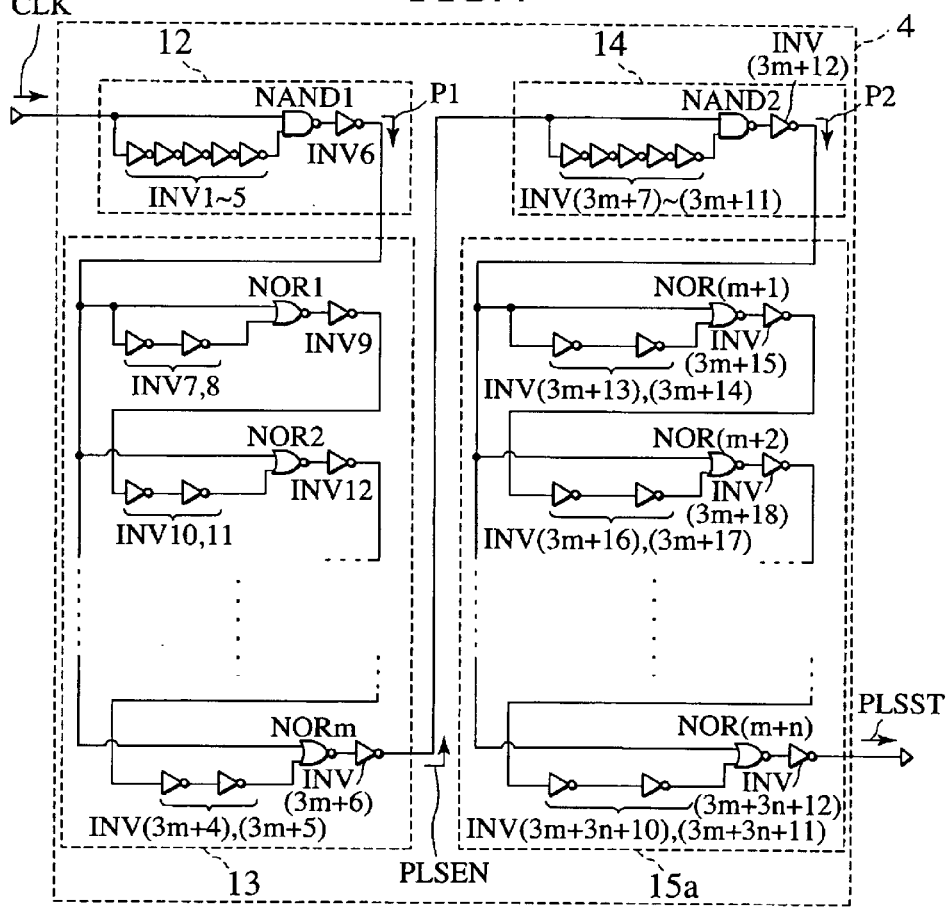
FIG. 4 is a circuit diagram illustrating the first through fourth circuits, which are included in the transition detection circuits illustrated in FIG. 2.

As illustrated in FIG. 4, the transition detection circuit 4 has first circuit 12, second circuit 13, third circuit 14 and fourth circuit 15a. The first circuit 12 has a first NAND circuit (hereafter, called "NAND 1") and first through sixth inverter circuits (hereafter called "INVs 1 through 6"). A clock signal CLK is directly applied to one of the input terminals of NAND 1. The clock signal CLK is applied to the other input terminal of NAND 1 via delay stages, which have serially connected INVs 1 through 5. The output of NAND 1 is transferred to INV 6. A first detection signal P1 is provided from INV 6.

The second circuit 13 includes a plurality (m stages) of delay circuits serially connected. The plurality of delay circuits respectively include first through m-th NOR circuits (hereafter called "NOR 1 through m") and seventh through (3m+6)-th inverter circuits (hereafter called "INVs 7 through (3m+6)"). In the first stage of the delay circuit, the first detection signal P1 is directly delivered to one of the input terminals of NOR 1. The first detection signal P1 is delivered to the other input terminal of NOR 1 via delay stages, which have serially connected INV 7 and INV 8. The output signal of NOR 1 is transferred to INV 9. The output signal of INV 9 is delivered to one of the input terminals of NOR 2 within the delay circuit of the next stage via the delay stages. The delay stages have serially connected INV 10 and INV 11. The first detection signal P1 is directly delivered to the other input terminal of NOR 2. Thereafter, a plurality of delay circuits are serially connected in a similar manner. An active signal PLSEN is provided from INV (3m+6) within the delay circuit of the last stage.

The third circuit 14 has a second NAND circuit (hereafter, called "NAND 2") and (3m+7)-th through (3m+12)-th inverter circuits (hereafter called "INVs (3m+7) through (3m+12)"). The active signal PLSEN is directly delivered to one of the input terminals of NAND 2. The active signal PLSEN is delivered to the other input terminal of NAND 2 via delay stages, which have serially connected INVs (3m+7) through (3m+11). The output signal of NAND 2 is transferred to INV (3m+12). A second detection signal P2 is provided from INV (3m+12).

The fourth circuit 15a includes a plurality (n stages) of serially connected delay circuits as with the second circuit 13. The plurality of delay circuits have (m+1)-th through (m+n)-th NOR circuits (hereafter, called "NOR (m+1) through (m+n)") and (3m+13)-th through (3m+3n+12)-th inverter circuits (hereafter, called "INVs (3m+13) through (3m+3n+12)"). In the first stage of the delay circuit, the second detection signal P2 is directly delivered to one of the input terminals of NOR (m+1). The second detection signal P2 is delivered to the other input terminal of NOR (m+1) via serially connected INV (3m+13) and INV (3m+14). The output signal of NOR (m+1) is transferred to INV (3m+15). The output signal of INV (3m+15) is delivered to one of the input terminals of NOR (m+2) within the delay circuit of the next stage via serially connected INV (3m+16) and INV (3m+17). The second detection signal P2 is directly delivered to the other input terminal of NOR (m+2). Hereafter, a plurality of delay circuits are serially connected in a similar manner. A pulse signal PLSST is delivered from INV (3m+3n+12) within the delay circuit of the last stage.

Figure 5:
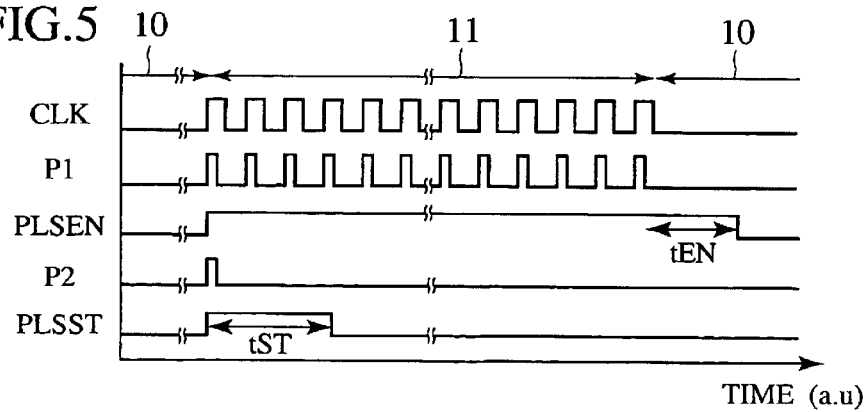
FIG. 5 is a time sequence showing change in the main signals over time in the operations of the transition detection circuit illustrated in FIG. 4.

Next, the operation of the semiconductor integrated circuit according to the first embodiment of the present invention is described while referencing FIG. 5.

The first circuit 12 of FIG. 4 detects the rise of the clock signal CLK, providing the first detection signal P1. The second circuit 13 of FIG. 4 delays the duration from the rise to the fall of the first detection signal P1 so that the second circuit 13 can deliver the active signal PLSEN while at least the internal circuit 1 is in the active state 11. The third circuit 14 of FIG. 4 detects the rise of the active signal PLSEN, delivering the second detection signal P2. The fourth circuit 15a of FIG. 4, by delaying the duration from the rise to the fall of the second detection signal P2, delivers the pulse signal PLSST. The pulse signal PLSST has a pulse width (indicated as "tST" in FIG. 5) corresponding to the "fixed time period" during which the first through third transition state voltage step-down circuits 2a through 2c of FIG. 2 operate. As such, the transition detection circuit 4 of FIG. 2 detects a standby state 10 upon finding that the clock signal CLK has not changed for some time. Then, the transition detection circuit 4 detects the change from the standby state 10 to an active state 11 upon finding that the clock signal CLK is beginning to change. Then, the transition detection circuit 4 transmits a pulse signal PLSST substantially simultaneous to when the clock signal CLK is supplied to the internal circuit 1.

The first through third transition state voltage step-down circuits 2a through 2c of FIG. 2 operate only when the pulse signal PLSST is being received. In other words, the first through third transition state voltage step-down circuits 2a through 2c supply the internal power supply voltage VINT to the internal circuit 1 only for a fixed time period after the internal circuit 1 has changed from the standby state 10 to the active state 11. An external power supply voltage VDD is applied to the control terminals 22d and 22e of the first and second steady state voltage step-down circuits 3a and 3b. Accordingly, the first and second steady state voltage step-down circuits 3a and 3b operate regardless of the internal circuit 1 being in the active state 11 or the standby state 10. In other words, the first and second steady state voltage step-down circuits 3a and 3b supply the internal power supply voltage VINT to the internal circuit 1 while the internal circuit 1 is in either the standby state 10 or the active state 11.

As described by referencing FIG. 1, along with change from the standby state 10 to the active state 11, the current dissipation of the internal circuit 1 greatly varies, causing the internal power supply voltage VINT to fluctuate. Furthermore, fluctuation in the internal power supply voltage VINT is greatest immediately after changing from the standby state 10 to the active state 11, gradually decreases thereafter. Consequently, the pulse width tST of the pulse signal PLSST shown in FIG. 2 is coordinated with the fixed time period immediately after changing from the standby state 10 to the active state 11. In other words, by operating the first through third transition state voltage step-down circuits 2a through 2c only for the fixed time period during which significant fluctuation of internal power supply voltage VINT is generated, the current supply capacity of the internal circuit 1 may be temporarily increased, and fluctuation of the internal power supply voltage VINT may be suppressed.

Next, the operation of the first through fourth circuits 12 through 14 and 15a illustrated in FIG. 4 is described in detail. Simultaneous to the rise of the clock signal CLK, the first detection signal P1 also rises. When the rise of the clock signal CLK passes through INVs 1 through 5 and is delivered to NAND 1, then the first detection signal P1 falls. Accordingly, the pulse width of the first detection signal P1 corresponds to the time period required for the clock signal CLK to pass through INVs 1 through 5. It should be noted that the number of delay stages serially connected to the other input terminal of NAND 1 is not limited to five stages, and may be any other odd number such as one, three or seven. According to increases in delay stage number, pulse width of the first detection signal P1 expands.

Since the first detection signal P1 is directly delivered to one of the input terminals of NOR 1, simultaneous to the rise of the first detection signal P1, the output of INV 9 also rises. Afterwards, the rise of the first detection signal P1 is also delivered to the other input terminal of NOR 1 by passing through INVs 7 and 8. The fall of the first detection signal P1 is directly delivered to one of the input terminals of NOR 1. However, The fall of the first detection signal P1 is delivered to the other input terminal of NOR 1 after passing through INVs 7 and 8. Accordingly, the fall of the INV 9 output signal is delayed only for the duration it passes through INV 7 and INV 8 rather than the fall of the first detection signal P1. Therefore, the rise of the INV 9 output signal is substantially simultaneous to the rise of the first detection signal P1. However, the fall of the INV 9 output signal is delayed so as to be after the fall of the first detection signal P1.

Due to serially connecting the above-mentioned plurality of delay circuits, INV (3m+6) is capable of delivering the active signal PLSEN at least while the clock signal CLK is being supplied. Furthermore, since the first detection signal P1 is directly delivered to each one of the respective input terminals of NOR 1, 2, . . . , m, the rise of the active signal PLSEN is never delayed more than the rise of the first detection signal P1. It should be noted that it is preferable for a fuse, which allows for metal options or laser blowing, to be formed in the second circuit 13. A user may freely set the number of delay circuits included in the second circuit 13 by blowing the fuse. Furthermore, the number of delay stages in each delay circuit is not limited to two stages, and may be another even number such as four, six or eight. According to increases in delay stage number, pulse width of the active signal PLSEN expands.

Since the active signal PLSEN is directly delivered to one of the input terminals of NAND2, the second detection signal P2 rises substantially simultaneous to the rise of the active signal PLSEN. As the rise of the active signal PLSEN passes through INVs (3m+7) through (3m+11) and is delivered to NAND 2, the second detection signal P2 falls. Accordingly, the pulse width of the second detection signal P2 corresponds to the time period required for the active signal PLSEN to pass through INVs (3m+7) through (3m+11). It should be noted that the number of delay stages serially connected to the other input terminal of NAND 2 is not limited to five stages, and may be other odd numbers such as one, three or seven. According to increases in delay stage number, the pulse width of the second detection signal P2 expands.

Since the second detection signal P2 is directly delivered to one of the input terminals of NOR (m+1), the output signal of INV (3m+15) rises substantially simultaneous to the rise of the second detection signal P2. Afterwards, the rise of the second detection signal P2 is also delivered to the other input terminal of NOR (m+1) by passing through INV (3m+13) and INV (3m+14). The fall of the second detection signal P2 is directly delivered to one of the input terminals of NOR (m+1). However, The fall of the second detection signal P2 is delivered to the other input terminal of NOR (m+1) after passing through INV (3m+13) and INV (3m+14). Accordingly, the fall of the output signal from INV (3m+15) is delayed only for the duration it passes through INV (3m+13) and INV (3m+14) rather than the fall of the second detection signal P2. Therefore, the rise of the INV (3m+15) output signal is substantially simultaneous to the rise of the second detection signal P2. However, the fall of the INV (3m+15) output signal is delayed so as to be after the fall of the second detection signal P2.

Due to serially connecting the above-mentioned plurality of delay circuits, INV (3m+3n+12) within the delay circuit of the last stage is capable of delivering the pulse signal PLSST for a fixed time period from when the second detection signal P2 rises. The first through third transition state voltage step-down circuits 2a through 2c of FIG. 2 operate with the pulse signal PLSST. Furthermore, since the second detection signal P2 is directly delivered to each one of the respective input terminals of NOR (m+1) through NOR (m+n), the rise of the pulse signal PLSST is never delayed more than the rise of the second detection signal P2. It should be noted that it is preferable for a fuse, which allows for metal options or laser blowing, to be formed in the fourth circuit 15a. A user may freely set the number of delay circuits included in the fourth circuit 15a by blowing the fuse. Furthermore, the number of delay stages the delay circuit has is not limited to two, and may be another even number such as four, six or eight. According to increases in stage number of the delay circuit, the pulse width of the pulse signal PLSST expands.

As described above, according to the first embodiment, even if current dissipation of the internal circuit 1 changes along with the change from the standby state 10 to the active state 11, fluctuations in internal power supply voltage VINT may be reduced. As a result, stabilized high-speed operation of the internal circuit 1 may be implemented.

Furthermore, the first through third transition state voltage step-down circuits 2a through 2c are operated for only the fixed time period tST immediately after changing from the standby state 10 to the active state 11, when fluctuations in internal power supply voltage VINT is the greatest. Accordingly, it does not need to enlarge the first through third transition state voltage step-down circuits 2a through 2c, and first and second steady state voltage step-down circuits 3a and 3b, therefore current consumption does not increase.

Moreover, since the first through third transition state voltage step-down circuits 2a through 2c are not operated in the active state 11 after lapse of the fixed time period tST, current consumption of the first through third transition state voltage step-down circuits 2a through 2c, first and second steady state voltage step-down circuits 3a and 3b in the active state 11 may be reduced.

In addition, it is no longer necessary to increase the internal capacitance 21, which is connected to the internal power supply voltage VINT.

It should be noted that fluctuation in the internal power supply voltage VINT is greatest when the current dissipation of the internal circuit 1 greatly changes, in other words, when changing from the standby state 10 to the active state 11. In order to decrease the fluctuation of the internal power supply voltage VINT, the p-type MOS transistor M7 and comparator circuit 9 in the first through third transition state voltage step-down circuits 2a through 2c, and the first and second steady state voltage step-down circuits 3a and 3b need to be enlarged. However, after changing from the standby state 10 to the active state 11, the change in current dissipation of the internal circuit 1 in the active state 11 is generally reduced. Accordingly, the first through third transition state voltage step-down circuits 2a through 2c, and first and second steady state voltage step-down circuits 3a and 3b no longer require such a large p-type MOS transistor M7 and/ or comparator circuit 9. Consequently, only when changing from the standby state 10 to the active state 11, the first through third transition state voltage step-down circuits 2a through 2c are operated for the fixed time period tST. Only the first and second steady state voltage step-down circuits 3a and 3b are operated in the subsequent active state 11. As a result, the current dissipation of the internal circuit 1 in the active state 11 may be reduced.

Modification of First Embodiment

Figure 6:
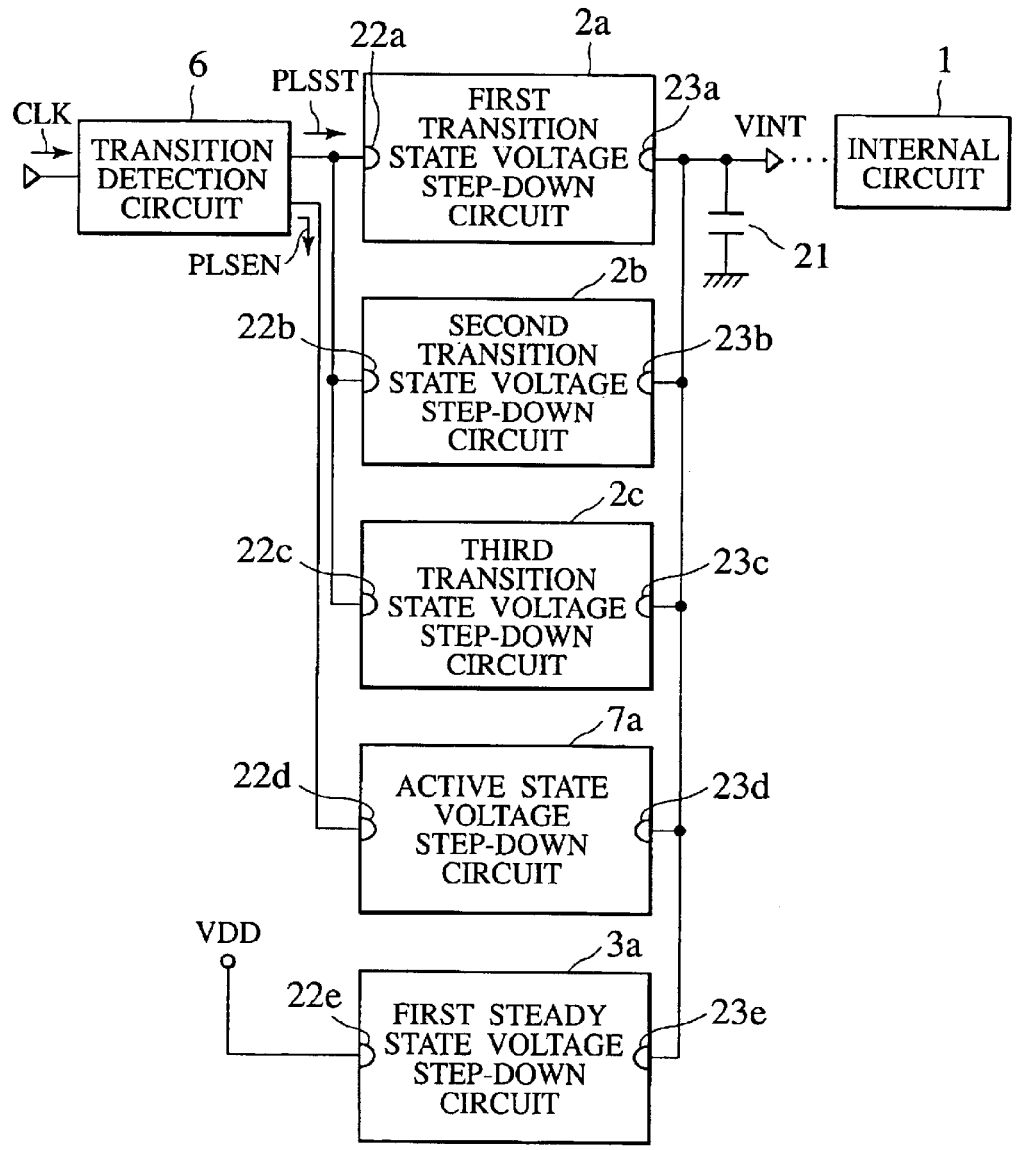
FIG. 6 is a block diagram illustrating a semiconductor integrated circuit according to a modification of the first embodiment of the present invention.

As illustrated in FIG. 6, a semiconductor integrated circuit according to a modification of the first embodiment includes first through third transition state voltage step-down circuits 2a through 2c, a first steady state voltage step-down circuit 3a, an active state voltage step-down circuit 7a, a transition detection circuit 6, and a capacitor 21. The active state voltage step-down circuit 7a has identical circuitry to the first through third transition state voltage step-down circuits 2a through 2c, and the first and second steady state voltage step-down circuits 3a and 3b shown in FIG. 3. An active signal PLSEN, which is sent from the transition detection circuit 6, is delivered to a control terminal 22d of the active state voltage step-down circuit 7a. An internal power supply voltage VINT that the active state voltage step-down circuit 7a generates, is applied to the internal circuit 1 similarly to as with the first through third transition state voltage step-down circuits 2a through 2c and the first steady state voltage step-down circuit 3a.

Figure 7:
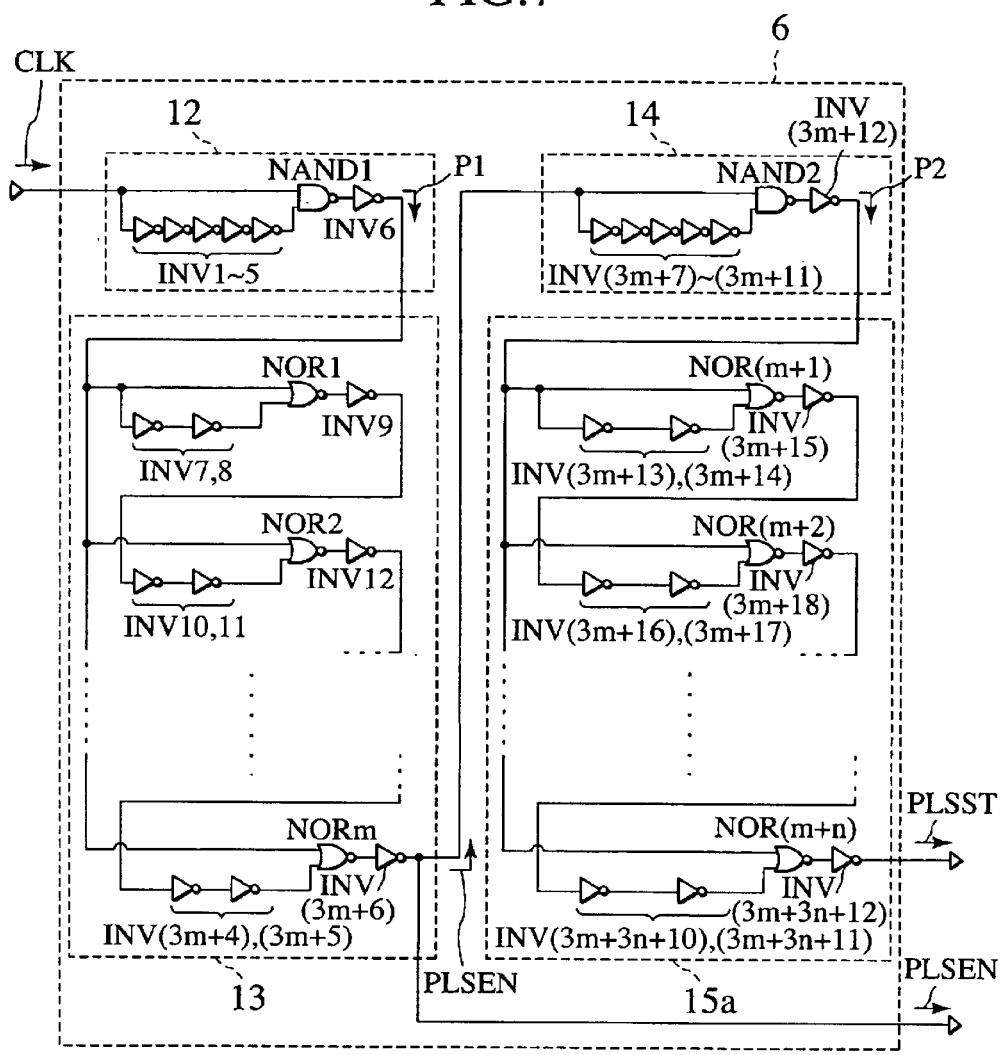
FIG. 7 is a circuit diagram illustrating the first through fourth circuits, which are included in the transition detection circuits illustrated in FIG. 6.

The transition detection circuit 6 illustrated in FIG. 7 has substantially the same structure as the transition detection circuit 4 illustrated in FIG. 4. The difference from the transition detection circuit 4 illustrated in FIG. 4 is that the active signal PLSEN is not only delivered to the third circuit 14, but is also provided to the outside of the transition detection circuit 6. Other aspects of the structure of the transition detection circuit 6 of FIG. 7 are the same as the transition detection circuit 4 of FIG. 4.

As shown in FIG. 5, the active signal PLSEN is provided for at least the duration that the internal circuit 1 is in the active state 11. Therefore, the active state voltage step-down circuit 7a operates while receiving the active signal PLSEN, namely, when the internal circuit 1 is at least in the active state 11. However the active state voltage step-down circuit 7a does not operate while in the standby state 10. By modifying a portion of the first and second steady state voltage step-down circuits 3a and 3b to be the active state step-down circuit 7a, the current dissipation of the active state step-down circuit 7a in the standby state 10 may be reduced.

As described above, the semiconductor integrated circuit according to the modification of the first embodiment heightens the current supply capacity in the active state 11, and is able to reduce the current dissipation of the first through third transition state voltage step-down circuits 2a through 2c, first steady state voltage step-down circuit 3a, and the active state voltage step-down circuit 7a in the standby state 10.

It should be noted that the time period tEN, that the active signal PLSEN is being provided after changing back from the active state 11 to the standby state 10, results from the delay time built up by the second circuit 13 of FIG. 7. The time period tEN may be shortened by reducing the number of delay circuits included in the second circuit 13. However, for the active signal PLSEN to be a single signal continuously provided at least while the internal circuit 1 is in the active state 11, the time period tEN must be fairly long. On the other hand, if the time period tEN is too long, the current dissipation of the first through third transition state voltage step-down circuits 2a through 2c, first steady state voltage step-down circuit 3a, and the active state voltage step-down circuit 7a in the standby state 10 may not be reduced.

Second Embodiment

Figure 8:
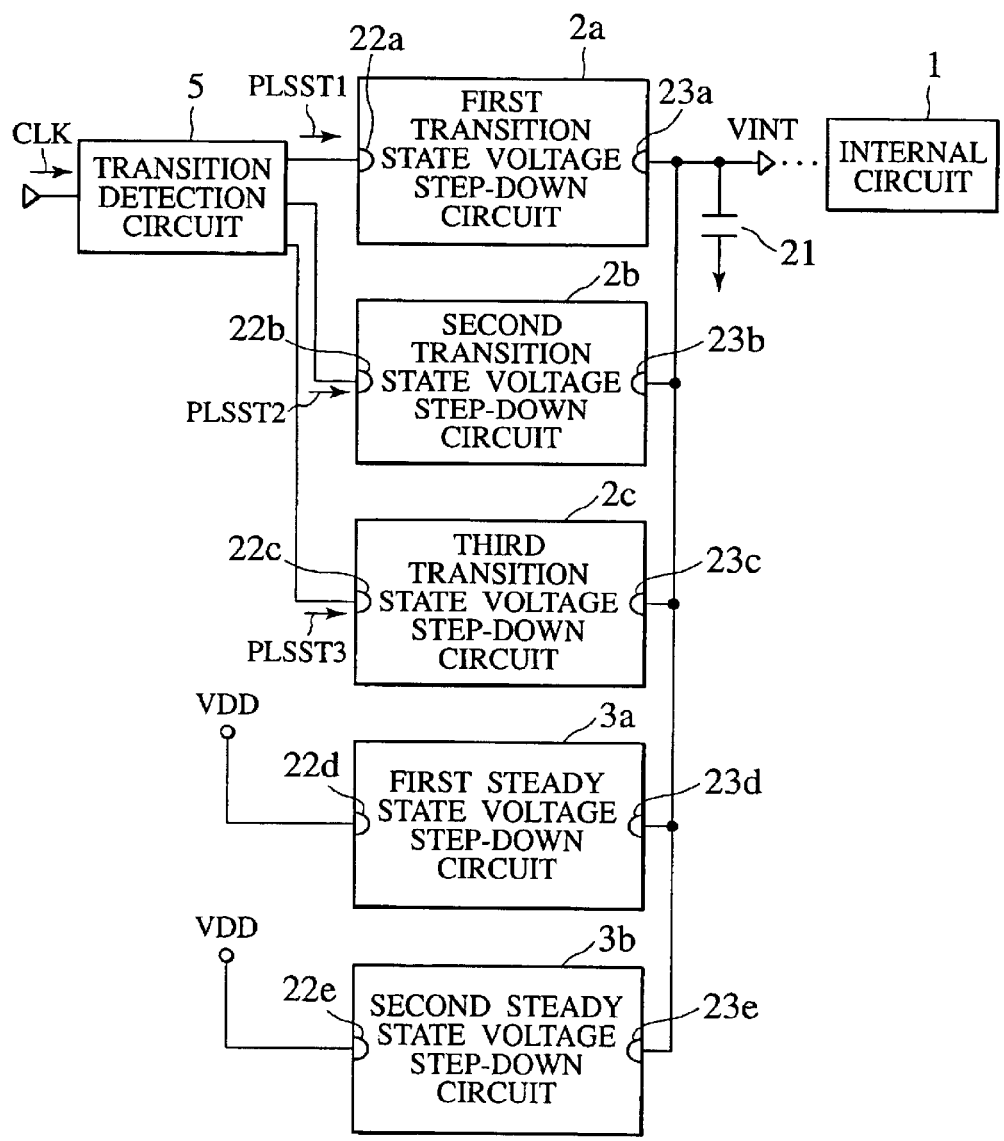
FIG. 8 is a block diagram showing a semiconductor integrated circuit according to a second embodiment of the present invention.

As illustrated in FIG. 8, a semiconductor integrated circuit according to a second embodiment includes an internal circuit 1, first through third transition state voltage step-down circuits 2a through 2c, first and second steady state voltage step-down circuits 3a and 3b, a transition detection circuit 5, and a capacitor 21. The first through third transition state voltage step-down circuits 2a through 2c, and the first and second steady state voltage step-down circuits 3a and 3b respectively include output terminals 23a through 23c, 23d and 23e, which provide internal power supply voltages VINTs, and control terminals 22a through 22c, 22d and 22e. The output terminals 23a through 23c, 23d and 23e of the first through third transition state voltage step-down circuits 2a through 2c, and the first and second steady state voltage step-down circuits 3a and 3b are connected in parallel. Each of the internal power supply voltages VINTs, which are generated by the first through third transition state voltage step-down circuits 2a through 2c, and the first and second steady state voltage step-down circuits 3a and 3b, are supplied to the internal circuit 1. The first through third transition state voltage step-down circuits 2a through 2c, and the first and second steady state voltage step-down circuits 3a and 3b respectively have the same circuitry as shown in FIG. 3.

The transition detection circuit 5 provides first through third pulse signals PLSST1, PLSST2 and PLSST3, which have pulse widths differing from one another. The first pulse signal PLSST1 is delivered to the control terminal 22a of the first transition state voltage step-down circuit 2a. The second pulse signal PLSST2 is delivered to the control terminal 22b of the second transition state voltage step-down circuit 2b. The third pulse signal PLSST3 is delivered to the control terminal 22c of the third transition state voltage step-down circuit 2c. An external power supply voltage VDD is applied to the control terminals 22d, and 22e of the first and second steady state voltage step-down circuits 3a and 3b. A clock signal CLK is supplied to the transition detection circuit 5 as with the internal circuit 1.

Figure 9:
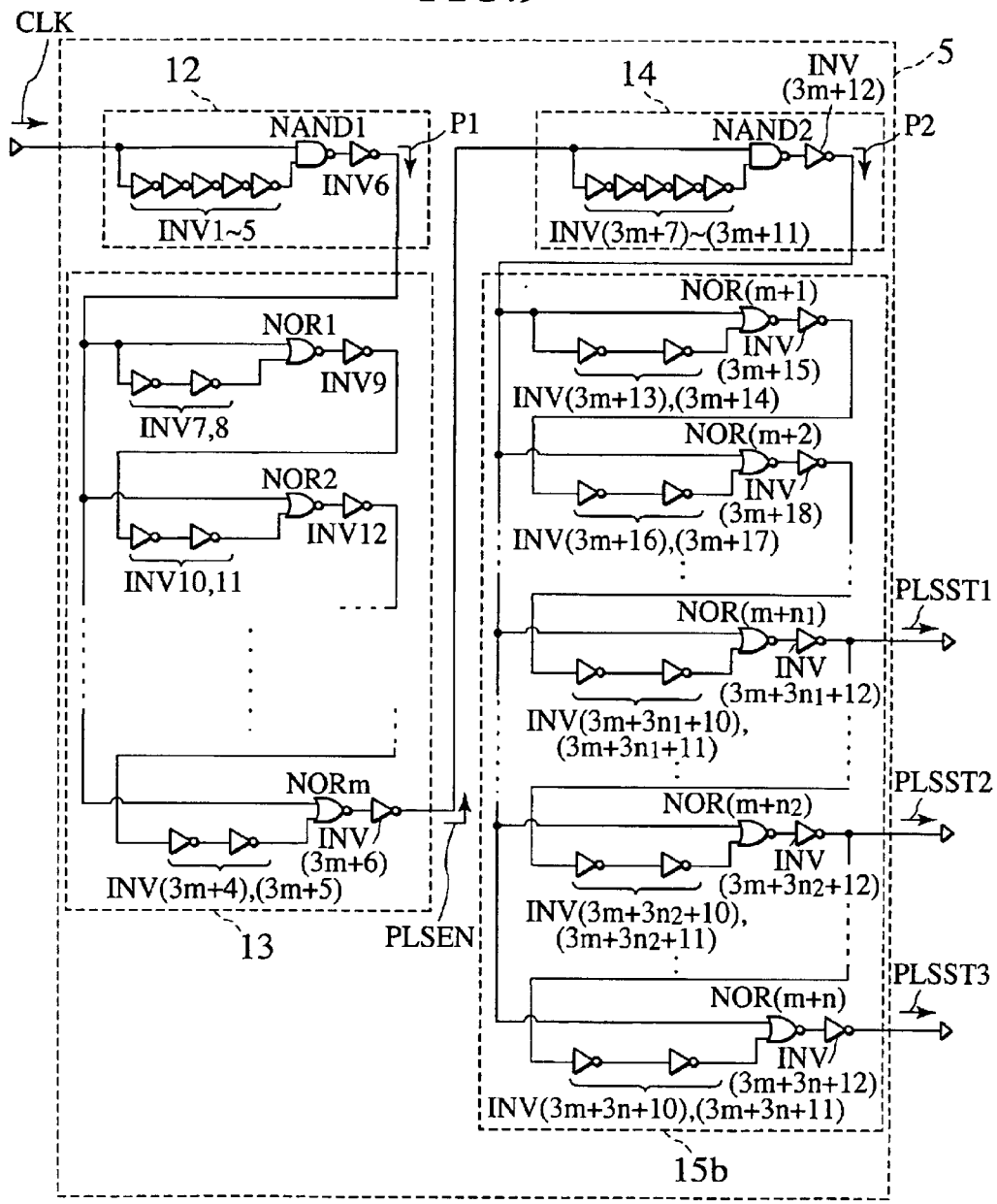
FIG. 9 is a circuit diagram illustrating the first through third circuits, which are included in the transition detection circuits illustrated in FIG. 8.

As illustrated in FIG. 9, the transition detection circuit 5 includes first circuit 12, second circuit 13, third circuit 14 and fourth circuit 15b. The first through third circuits 12 through 14 respectively have the same circuitry as shown in FIG. 4. The fourth circuit 15b includes a plurality (n stages) of delay circuits serially connected. The plurality of delay circuits include (m+1)-th through (m+n)-th NOR circuits (hereafter, called "NOR (m+1) through (m+n)"), and (3m+13)-th through (3m+3n+12)-th inverter circuits (hereafter, called "INVs (3m+13) through (3m+3n+12)"). Configuration of the delay circuits is the same as the delay circuits within the fourth circuit 15a shown in FIG. 4. The first pulse signal PLSST1 is taken from INV $(3m+3n_1+12)$ within a delay circuit that is positioned midpoint the fourth circuit 15b. The second pulse signal PLSST2 is taken from INV $(3m+3n_2+12)$ within a delay circuit that is positioned at a later stage than INV $(3m+3n_1+12)$. The third pulse signal PLSST3 is taken from INV $(3m+3n_3+12)$ within a delay circuit that is positioned at a later stage than INV $(3m+3n_2+12)$.

Figure 10:
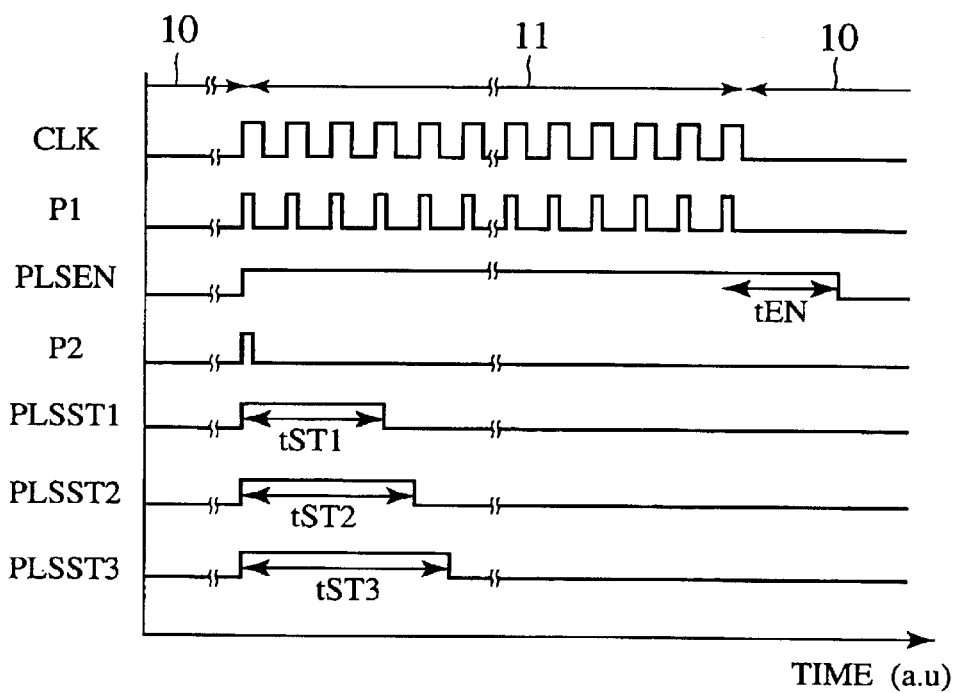
FIG. 10 is a time sequence showing change in the main signals over time in the operation of the transition detection circuits illustrated in FIG. 9.

Next, the operation of the semiconductor integrated circuit according to the second embodiment of the present invention is described while referencing FIG. 10.

The first circuit 12 of FIG. 9 detects the rise of the clock signal CLK, delivering the first detection signal P1. The second circuit 13 delays the duration from the rise to the fall of the first detection signal P1 so that the internal circuit 1 can deliver the active signal PLSEN during at least the period of the active state 11. The third circuit 14 detects the rise of the active signal PLSEN, delivering the second detection signal P2. The fourth circuit 15b, by delaying the duration from the rise to the fall of the second detection signal P2, delivers the first through third pulse signals PLSST1 through PLSST3. The first through third pulse signals PLSST1 through PLSST3 have pulse widths (indicated as "tST1 through tST3" in FIG. 10) corresponding to the "fixed time periods". The first through third transition state voltage step-down circuits 2a through 2c of FIG. 8 operate for the fixed time periods. The pulse width tST1 of the first pulse signal PLSST1 is the shortest. The pulse width tST2 of the second pulse signal PLSST2 is longer than the pulse width tST1 of the first pulse signal PLSST1. The pulse width tST3 of the third pulse signal PLSST3 is longer than the pulse width tST2 of the second pulse signal PLSST2.

The first through third transition state voltage step-down circuits 2a through 2c of FIG. 8 respectively operate while the first through third pulse signals PLSST1 through PLSST3 are being received. In other words, the first through third transition state voltage step-down circuits 2a through 2c supply the internal power supply voltage VINT to the internal circuit 1 only for the fixed time periods (tST1 through tST3) after the internal circuit 1 has changed from standby state to active state. The first and second steady state voltage step-down circuits 3a and 3b supply the internal power supply voltage VINT to the internal circuit 1 while the internal circuit 1 is in either the standby state 10 or the active state 11.

In the first embodiment, the first through third transition state voltage step-down circuits 2a through 2c are operated during the fixed time period tST after changing from the standby state 10 to the active state 11, simultaneously halting the operation of the first through third transition state voltage step-down circuits 2a through 2c thereafter. Since the first through third transition state voltage step-down circuits 2a through 2c are simultaneously halted, there are cases where the internal power supply voltage VINT fluctuates. In other words, while fluctuation of the internal power supply voltage VINT due to the change from the standby state 10 to the active state 11 is reduced, at the time that the first through third transition state voltage step-down circuits 2a through 2c are subsequently halted, there are cases where the internal power supply voltage VINT fluctuates.

Accordingly, the second embodiment begins the operation of the first through third transition state voltage step-down circuits 2a through 2c immediately after changing from the standby state 10 to the active state 11, and halts the operation thereof in order according to the first through third pulse signals PLSST1 through PLSST3 with differing pulse widths. Consequently, according to the second embodiment, not only do the same operations and effectiveness occur as with the semiconductor integrated circuit according to the first embodiment, but also it is possible to control fluctuations in the internal power supply voltage VINT that are caused when the operation of the first through third transition state voltage step-down circuits 2a through 2c halts.

It should be noted that it is preferable for a fuse, which allows for metal options or laser blowing, to be formed. A user may freely set the number of stages in the delay circuits included in the fourth circuit 15b by blowing the fuse. Flexibility of design in pulse width of the first through third pulse signals PLSST1 through PLSST3 is improved.

Modification of Second Embodiment

Figure 11:
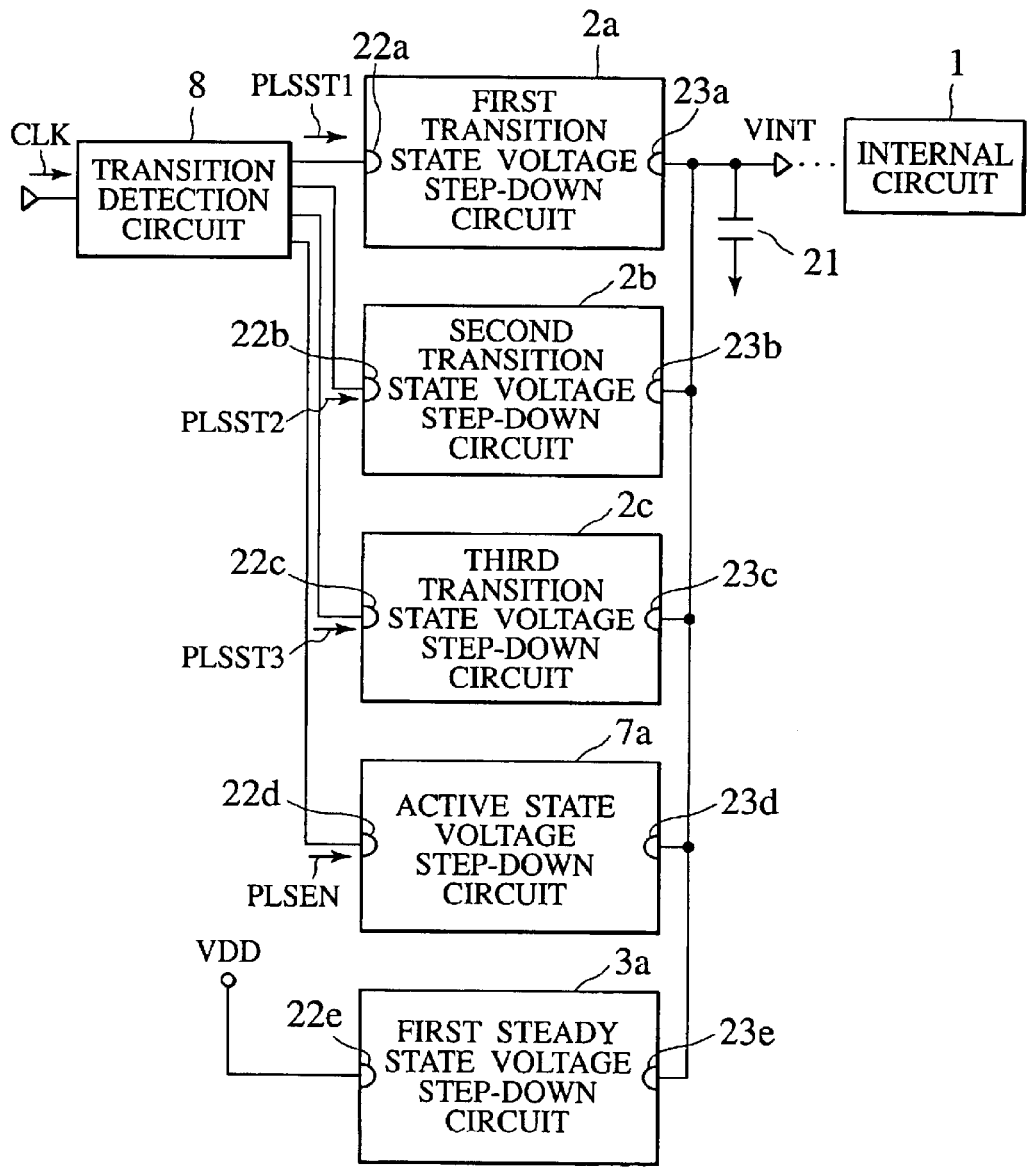
FIG. 11 is a block diagram illustrating a semiconductor integrated circuit according to a modification of the second embodiment of the present invention.

As illustrated in FIG. 11, a semiconductor integrated circuit according to a modification of the second embodiment includes first through third transition state voltage step-down circuits 2a through 2c, a first steady state voltage step-down circuit 3a, an active state voltage step-down circuit 7a, a transition detection circuit 8, and a capacitor 21. The active state voltage step-down circuit 7a has circuitry identical to the first through third transition state voltage step-down circuits 2a through 2c and the first and second steady state voltage step-down circuits 3a and 3b shown in FIG. 3. An internal power supply voltage VINT, which is generated from the active state voltage step-down circuit 7a, is applied to the internal circuit 1 similarly to as with the first through third transition state voltage step-down circuits 2a through 2c and the first steady state voltage step-down circuit 3a. The transition detection circuit 8 delivers the first through third pulse signals PLSST1, PLSST2 and PLSST3, which have pulse widths differing from one another, and an active signal PLSEN. The first through third pulse signals PLSST1, PLSST2 and PLSST3 are respectively delivered to the control terminals 22a through 22c of the first through third transition state voltage step-down circuits 2a through 2c. The active signal PLSEN is delivered to a control terminal 22d of the active state voltage step-down circuit 7a.

Figure 12:
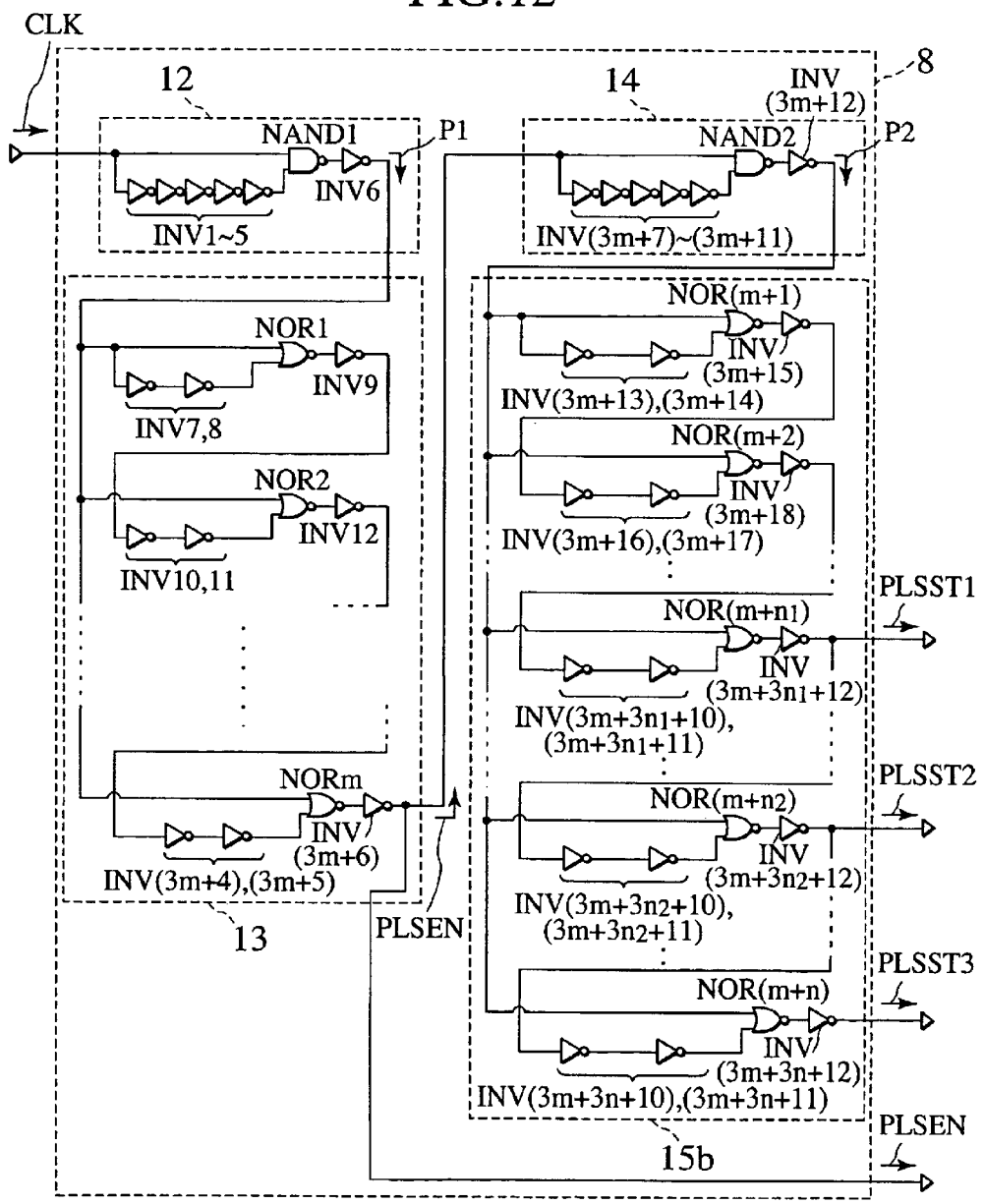
FIG. 12 is a circuit diagram illustrating the first through fourth circuits, which are included in the transition detection circuits illustrated in FIG. 11.

The transition detection circuit 8 illustrated in FIG. 12 has substantially the same configuration as the transition detection circuit 5 illustrated in FIG. 9. The difference from the transition detection circuit 5 illustrated in FIG. 9 is that an active signal PLSEN is not only delivered to the third circuit 14, but is also provided to the outside of the transition detection circuit 8. Other aspects of the configuration of the transition detection circuit 8 of FIG. 12 are the same as the transition detection circuit 5 of FIG. 9.

As shown in FIG. 10, the active signal PLSEN is provided for at least the duration that the internal circuit 1 is in the active state 11. Therefore, the active state voltage step-down circuit 7a operates while the active signal PLSEN is being received. By modifying a portion of the first and second steady state voltage step-down circuits 3a and 3b illustrated in FIG. 8 to be the active state step-down circuit 7a, the current dissipation of the active state step-down circuit 7a in the standby state 10 may be reduced.

As described above, the semiconductor integrated circuit according to the modification of the second embodiment heightens the current supply capacity in the active state 11, and is able to reduce the current dissipation of the first through third transition state voltage step-down circuits 2a through 2c, first steady state voltage step-down circuit 3a, and the active state voltage step-down circuit 7a in the standby state 10.

As mentioned above, the present invention has been described through the first and second embodiments, and modifications thereof, however, the descriptions and drawings that constitute a portion of this disclosure should not be perceived as those limiting this invention. Various alternative embodiments and operational techniques will become clear to persons skilled in the art from this disclosure.

For example, according to the first and second embodiments, and modifications thereof, the number of the first through third transition state voltage step-down circuits 2a through 2c has been described for the case of three circuits. However the semiconductor device according to the present invention is not limited thereto, and the number of transition state voltage step-down circuits may be one, two, four or more. Similarly, the first and second steady state voltage step-down circuits 3a and 3b are not limited to the case of two or one circuits, but may be three or more. The same also applies to the active state voltage step-down circuit 7a.

Figure 13:
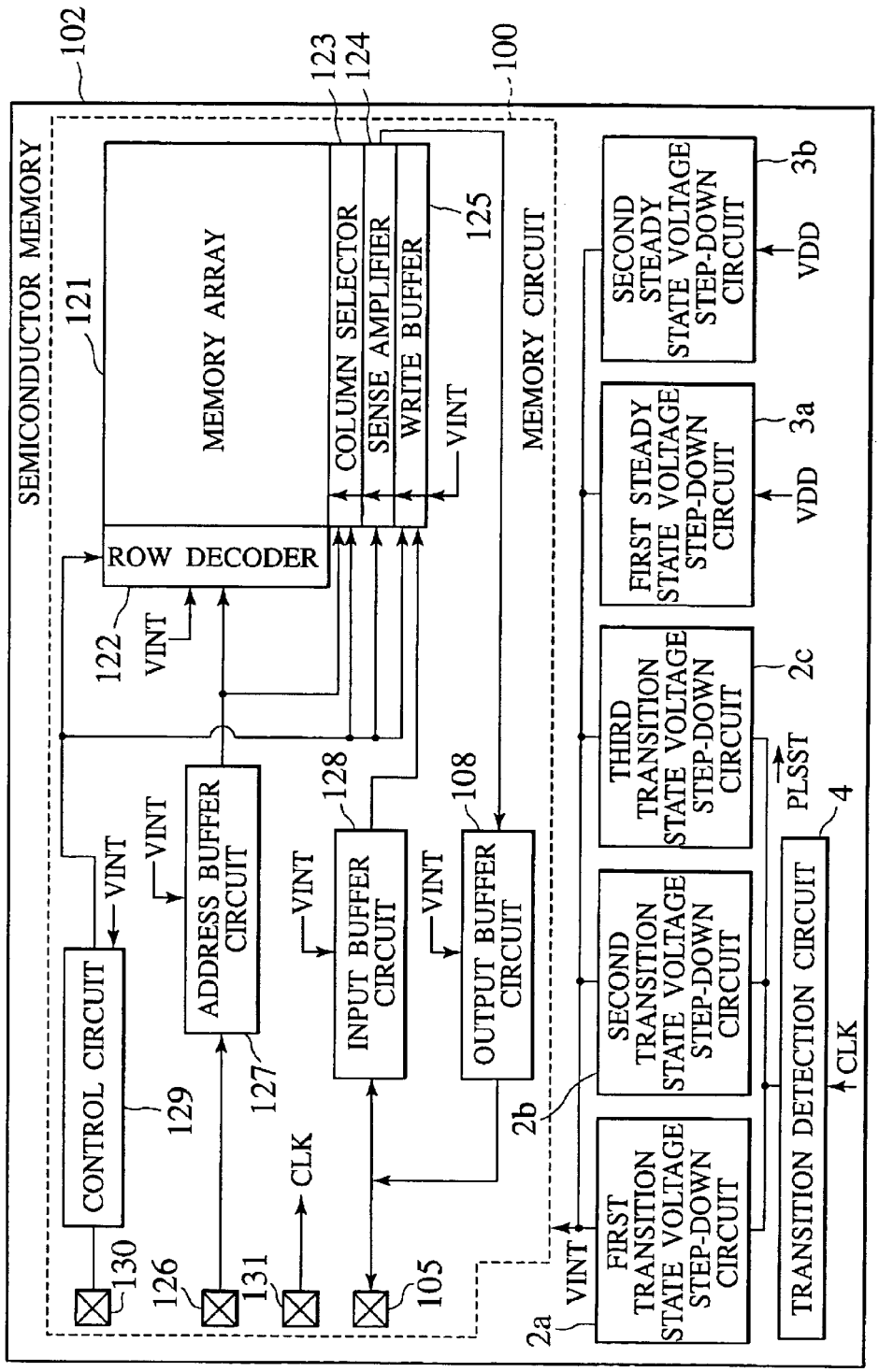
FIG. 13 is a block diagram showing a semiconductor memory, which has a semiconductor integrated circuit according to the first embodiment of the present invention.

Furthermore, the present invention may be implemented as a semiconductor memory such as static RAM (SRAM), wherein memory content is maintained as long as a power supply voltage is applied thereto. The semiconductor memory includes the semiconductor integrated circuit described in the first and second embodiments of the present invention. As illustrated in FIG. 13, the semiconductor memory 102 includes a memory circuit 100, the first through third transition state voltage step-down circuits 2a through 2c, the first and second steady state voltage step-down circuits 3a and 3b, and a transition detection circuit 4. The memory circuit 100 implements key functions of the semiconductor memory such as writing, reading and holding data. The first through third transition state voltage step-down circuits 2a through 2c generate an internal power supply voltage VINT from the external power supply voltage VDD only for the fixed time period after the memory circuit 100 has changed from the standby state 10 to the active state 11. The first and second steady state voltage step-down circuits 3a and 3b generate an internal power supply voltage VINT from the external power supply voltage VDD. The transition detection circuit 4 detects the change from the standby state 10 to the active state 11, transmitting the pulse signal PLSST to the first through third transition state voltage step-down circuits 2a through 2c.

The memory circuit 100 includes a memory array 121, a row decoder 122, a column selector 123, a write buffer 125, an address terminal 126 whereto address data is delivered, an address buffer circuit 127, an input terminal 105, an input buffer circuit 128, an output buffer circuit 108, a control terminal 130, a timing control circuit 129, and a clock terminal 131 whereto the clock signal CLK is provided. The memory array 121 includes a plurality of memory cells arranged in matrix form. The row decoder 122 and column selector 123 select a desired memory cell. The address buffer circuit 127 is connected to the address terminal 126, row decoder 122, and column selector 123, respectively. The input buffer circuit 128 and output buffer circuit 108 are connected to the input terminal 105. The timing control circuit 129 controls the timing of operation during writing or reading.

The clock signal CLK is supplied to the row decoder 122, column selector 123, sense amplifier 124, write buffer 125, address buffer circuit 127, input buffer circuit 128, output buffer circuit 108, control circuit 129, and transition detection circuit 4, respectively. Furthermore, the internal power supply voltage VINT is supplied to the memory array 121, row decoder 122, column selector 123, sense amplifier 124, write buffer 125, address buffer circuit 127, input buffer circuit 128, output buffer circuit 108, and control circuit 129, respectively.

The address data is transferred from the address terminal 126 and supplied to the row decoder 122 and column selector 123 via the address buffer circuit 127. The address data selects the desired write memory cell or read out memory cell within the memory array 121. While writing, the write data delivered from the input terminal 105 is provided to the write buffer 125 via the input buffer circuit 128 so as to write onto the desired read cell within the memory array 121. Meanwhile, while reading out, the read out data read out from the selected read out cell is provided to the output buffer circuit 108 via the sense amplifier 124, and is driven from the output buffer circuit 108 to the outside of the semiconductor memory 102 via the input terminal 105.

The timing control circuit supplies the row decoder 122, column selector 123, sense amplifier 124, and write buffer 125 with the timing control signal provided from the control terminal 130, respectively, so as to control the timing of operation while writing or reading.

Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit, comprising:
   an internal circuit;
   a transition state voltage step-down circuit generating an internal power supply voltage supplied to said internal circuit from an external power supply voltage only for a fixed time period after said internal circuit is changed from a standby state to an active state; and
   a steady state voltage step-down circuit generating the internal power supply voltage from the external power supply voltage for duration that said internal circuit is in either the standby state or the active state,
   wherein the fixed time period is only part of the active state.

2. The semiconductor integrated circuit of claim 1, further comprising a transition detection circuit detecting a change from the standby state to the active state, transmitting to said transition state voltage step-down circuit a pulse signal having a pulse width corresponding to the fixed time period, wherein said transition state voltage step-down circuit generates the internal power supply voltage from the external power supply voltage while receiving the pulse signal.

3. The semiconductor integrated circuit of claim 1, further comprising an active state voltage step-down circuit generating the internal power supply voltage from the external power supply voltage for at least duration that said internal circuit is in the active state.

4. The semiconductor integrated circuit of claim 3, further comprising a transition detection circuit detecting a change from the standby state to the active state, transmitting to said transition state voltage step-down circuit a pulse signal having a pulse width corresponding to the fixed time period, and transmitting to said active state voltage step-down circuit an active signal for at least duration that said internal circuit is in the active state, wherein said transition state voltage step-down circuit generates the internal power supply voltage from the external power supply voltage while receiving the pulse signal, and said active state voltage step-down circuit generates the internal power supply voltage from the external power supply voltage while receiving the active signal.

5. The semiconductor integrated circuit of claim 1, further comprising a second transition state voltage step-down circuit generating the internal power supply voltage only for a second fixed time period differs from the fixed time period.

6. The semiconductor integrated circuit of claim 5, further comprising a transition detection circuit detecting a change from the standby state to the active state, respectively transmitting to said transition state voltage step-down circuit and said second transition state voltage step-down circuit pulse signals having pulse widths differing from one another, wherein said transition state voltage step-down circuit and said second transition state voltage step-down circuit respectively generate the internal power supply voltage from the external power supply voltage while receiving the pulse signals.

7. The semiconductor integrated circuit of claim 5, further comprising an active state voltage step-down circuit generating the internal power supply voltage from the external power supply voltage for at least duration that said internal circuit is in the active state.

8. The semiconductor integrated circuit of claim 7, further comprising a transition detection circuit detecting a change from the standby state to the active state, respectively transmitting to said transition state voltage step-down circuit and said second transition state voltage step-down circuit a plurality of pulse signals having pulse widths differing from one another, and transmitting to said active state voltage step-down circuit an active signal for at least duration that said internal circuit is in the active state, wherein said transition state voltage step-down circuit and said second transition state voltage step-down circuit generate the internal power supply voltage from the external power supply voltage while receiving the pulse signal, and said active state voltage step-down circuit generates the internal power supply voltage from the external power supply voltage while receiving the active signal.

9. The semiconductor integrated circuit of claim 1, wherein the active state is a state where a clock signal is being supplied to said internal circuit, and the standby state is a state where the clock signal is not being supplied to said internal circuit.

10. The semiconductor integrated circuit of claim 2, wherein said transition detection circuit comprises:
   a first circuit detecting rise of a clock signal and delivering a first detection signal,
   a second circuit delivering an active signal for at least duration that said internal circuit is in the active state by delaying duration from rise to fall of the first detection signal,
   a third circuit detecting rise of the active signal and delivering a second detection signal, and
   a fourth circuit delivering a pulse signal by delaying duration from rise to fall of the second detection signal.

11. A semiconductor memory, comprising:
   a memory circuit;
   a transition state voltage step-down circuit generating an internal power supply voltage supplied to said memory circuit from an external power supply voltage only for a fixed time period after said memory circuit is changed from a standby state to an active state; and
   a steady state voltage step-down circuit generating the internal power supply voltage from the external power supply voltage for duration that said memory circuit is in either the standby state or the active state,
   wherein the fixed time period is only part of the active state.

12. The semiconductor memory of claim 11, further comprising a transition detection circuit detecting a change from the standby state to the active state, transmitting to said transition state voltage step-down circuit a pulse signal having a pulse width corresponding to the fixed time period, wherein said transition state voltage step-down circuit generates the internal power supply voltage from the external power supply voltage while receiving the pulse signal.

13. The semiconductor memory of claim 11, further comprising an active state voltage step-down circuit generating the internal power supply voltage from the external power supply voltage for at least duration that said memory circuit is in the active state.

14. The semiconductor memory of claim 13, further comprising a transition detection circuit detecting a change from the standby state to the active state, transmitting to said transition state voltage step-down circuit a pulse signal having a pulse width corresponding to the fixed time period, and transmitting to said active state voltage step-down circuit an active signal for at least duration that said memory circuit is in the active state, wherein said transition state voltage step-down circuit generates the internal power supply voltage from the external power supply voltage while receiving the pulse signal, and said active state voltage step-down circuit generates internal power supply voltage from the external power supply voltage while receiving the active signal.

15. The semiconductor memory of claim 11, further comprising a second transition state voltage step-down circuit generating the internal power supply voltage only for a second fixed time period differs from the fixed time period.

16. The semiconductor memory of claim 15, further comprising a transition detection circuit detecting a change from the standby state to the active state, respectively transmitting to said transition state voltage step-down circuit and said second transition state voltage step-down circuit a plurality of pulse signals having pulse widths differing from one another, wherein said transition state voltage step-down circuit and said second transition state voltage step-down circuit respectively generate the internal power supply voltage from the external power supply voltage while receiving the pulse signals.

17. The semiconductor memory of claim 15, further comprising an active state voltage step-down circuit generating the internal power supply voltage from the external power supply voltage for at least duration that said memory circuit is in the active state.

18. The semiconductor memory of claim 17, further comprising a transition detection circuit detecting a change from the standby state to the active state, respectively transmitting to said transition state voltage step-down circuit and said second transition state voltage step-down circuit a plurality of pulse signals having pulse widths differing from one another, and transmitting to said active state voltage step-down circuit an active signal for at least duration that said memory circuit is in the active state, wherein said transition state voltage step-down circuit and said second transition state voltage step-down circuit respectively generate the internal power supply voltage from the external power supply voltage while receiving the pulse signal, and said active state voltage step-down circuit generates the internal power supply voltage from the external power supply voltage while receiving the active signal.

19. The semiconductor memory of claim 11, wherein the active state is a state where a clock signal is being supplied to said memory circuit, and the standby state is a state where the clock signal is not being supplied to said memory circuit.

20. The semiconductor memory of claim 12, wherein said transition detection circuit comprises:
   a first circuit detecting rise of a clock signal and delivering a first detection signal,
   a second circuit delivering an active signal for at least duration that said memory circuit is in the active state by delaying duration from rise to fall of the first detection signal,
   a third circuit detecting rise of the active signal and delivering a second detection signal, and
   a fourth circuit delivering a pulse signal by delaying duration from rise to fall of the second detection signal.

* * * * *